US009708178B2

(12) United States Patent
Teh et al.

(10) Patent No.: US 9,708,178 B2
(45) Date of Patent: Jul. 18, 2017

(54) INTEGRATION OF LAMINATE MEMS IN BBUL CORELESS PACKAGE

(75) Inventors: Weng Hong Teh, Phoenix, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/995,924

(22) PCT Filed: Dec. 30, 2011

(86) PCT No.: PCT/US2011/068034
§ 371 (c)(1),
(2), (4) Date: Jun. 19, 2013

(87) PCT Pub. No.: WO2013/101156
PCT Pub. Date: Jul. 4, 2013

(65) Prior Publication Data
US 2014/0203379 A1     Jul. 24, 2014

(51) Int. Cl.
*B81B 7/02* (2006.01)
*B81B 7/00* (2006.01)
*B81C 1/00* (2006.01)
*H01L 23/00* (2006.01)
*H05K 1/18* (2006.01)

(52) U.S. Cl.
CPC .......... *B81B 7/0006* (2013.01); *B81C 1/0023* (2013.01); *B81C 1/00134* (2013.01);
(Continued)

(58) Field of Classification Search
CPC .......... H01L 23/5389; H01L 23/49822; H01L 2924/1517; H01L 2924/1461; H01L 2224/821; B81B 7/0006; B81B 2207/012; B81B 2207/091; B81B 7/0032; H05K 1/185
(Continued)

(56) References Cited

U.S. PATENT DOCUMENTS 7,030,494 B2 * 4/2006 Aoki .................... H01L 23/5389
                                                        257/415
7,321,164 B2    1/2008 Hsu
(Continued)

OTHER PUBLICATIONS

Intel Corporation, et al., International Search Report and Written Opinion mailed Sep. 27, 2012 for PCT/US2011/068034.
(Continued)

*Primary Examiner* — Marcos D Pizarro
(74) *Attorney, Agent, or Firm* — Blakely, Sokoloff, Taylor & Zafman LLP (57) ABSTRACT

An apparatus including a die including a first side and an opposite second side including a device side with contact points and lateral sidewalls defining a thickness of the die; a build-up carrier coupled to the second side of the die, the build-up carrier including a plurality of alternating layers of conductive material and insulating material, wherein at least one of the layers of conductive material is coupled to one of the contact points of the die; and at least one device within the build-up carrier disposed in an area void of a layer of patterned conductive material. A method and an apparatus including a computing device including a package including a microprocessor are also disclosed.

15 Claims, 8 Drawing Sheets

(52) U.S. Cl.
CPC ..... *B81B 2207/012* (2013.01); *B81B 2207/07* (2013.01); *H01L 24/24* (2013.01); *H01L 24/82* (2013.01); *H01L 2224/0401* (2013.01); *H01L 2224/04105* (2013.01); *H01L 2224/16135* (2013.01); *H01L 2224/32225* (2013.01); *H01L 2224/32245* (2013.01); *H01L 2224/73204* (2013.01); *H01L 2224/73259* (2013.01); *H01L 2224/73267* (2013.01); *H01L 2224/821* (2013.01); *H01L 2224/82047* (2013.01); *H01L 2224/92244* (2013.01); *H01L 2224/97* (2013.01); *H01L 2924/10253* (2013.01); *H01L 2924/12042* (2013.01); *H01L 2924/1461* (2013.01); *H01L 2924/15311* (2013.01); *H05K 1/185* (2013.01)

(58) Field of Classification Search
USPC ......... 257/700, 758, 777, E23.169, E23.178, 257/414
See application file for complete search history.

(56) References Cited

U.S. PATENT DOCUMENTS

| | | | |
|---|---|---|---|
| 8,071,398 B1* | 12/2011 | Yang | B81C 1/00246 257/459 |
| 8,552,556 B1* | 10/2013 | Kim et al. | 257/738 |
| 8,633,551 B1* | 1/2014 | Teh | H01L 24/19 257/414 |
| 2004/0262645 A1* | 12/2004 | Huff | B81B 7/0064 257/232 |
| 2009/0224378 A1 | 9/2009 | Chen et al. | |
| 2011/0228464 A1 | 9/2011 | Guzek et al. | |
| 2011/0316140 A1 | 12/2011 | Nalla et al. | |

OTHER PUBLICATIONS

Intel Corporation, et al., International Preliminary Report on Patentability dated Jul. 10, 2014 for PCT/US2011/068034.

* cited by examiner

INTEGRATION OF LAMINATE MEMS IN BBUL CORELESS PACKAGE

CROSS-REFERENCE TO RELATED APPLICATION

This patent application is a U.S. National Phase Application under 35 U.S.C. §371 of International Application No. PCT/US2011/068034, filed Dec. 30, 2011, entitled INTEGRATION OF LAMINATE MEMS IN BBUL CORELESS PACKAGE.

BACKGROUND

Field

Packaging for microelectronic devices.

Description of Related Art

Microelectromechanical systems (MEMS) devices are a micro or nano device that integrates mechanical and electrical elements on a common substrate typically using microfabrication technology. The mechanical elements are fabricated using lithographic processes on a substrate, such as a silicon substrate, to selectively pattern the devices according to known techniques. Additional layers are often added to the substrates and then micromachined until the MEMS device is in a design configuration. MEMS devices include actuators, sensors, switches, accelerometers, modulators and optical devices (MEMS).

Because a MEMS device typically involves a fabrication of mechanical elements with electrical elements on the same device, such as a silicon die, the real estate available for location and number of devices is limited to the size of the die.

Microelectronic devices, including MEMS devices, are typically contained in a package that allows a connection to another device, such as a printed circuit board. Microelectronic packaging technology, including methods to mechanically and electrically attach a silicon die (e.g., a microprocessor) to a substrate or other carrier continues to be refined and improved. Bumpless Build-Up Layer (BBUL) technology is one approach to a packaging architecture. Among its advantages, BBUL eliminates the need for assembly, eliminates prior solder ball interconnections (e.g., flip-chip interconnections), reduces stress on low-k interlayer dielectric of dies due to die-to-substrate coefficient of thermal expansion (CTE mismatch), and reduces package inductance through elimination of core and flip-chip interconnect for improved input/output (I/O) and power delivery performance.

DETAILED DESCRIPTION

Figure 1:
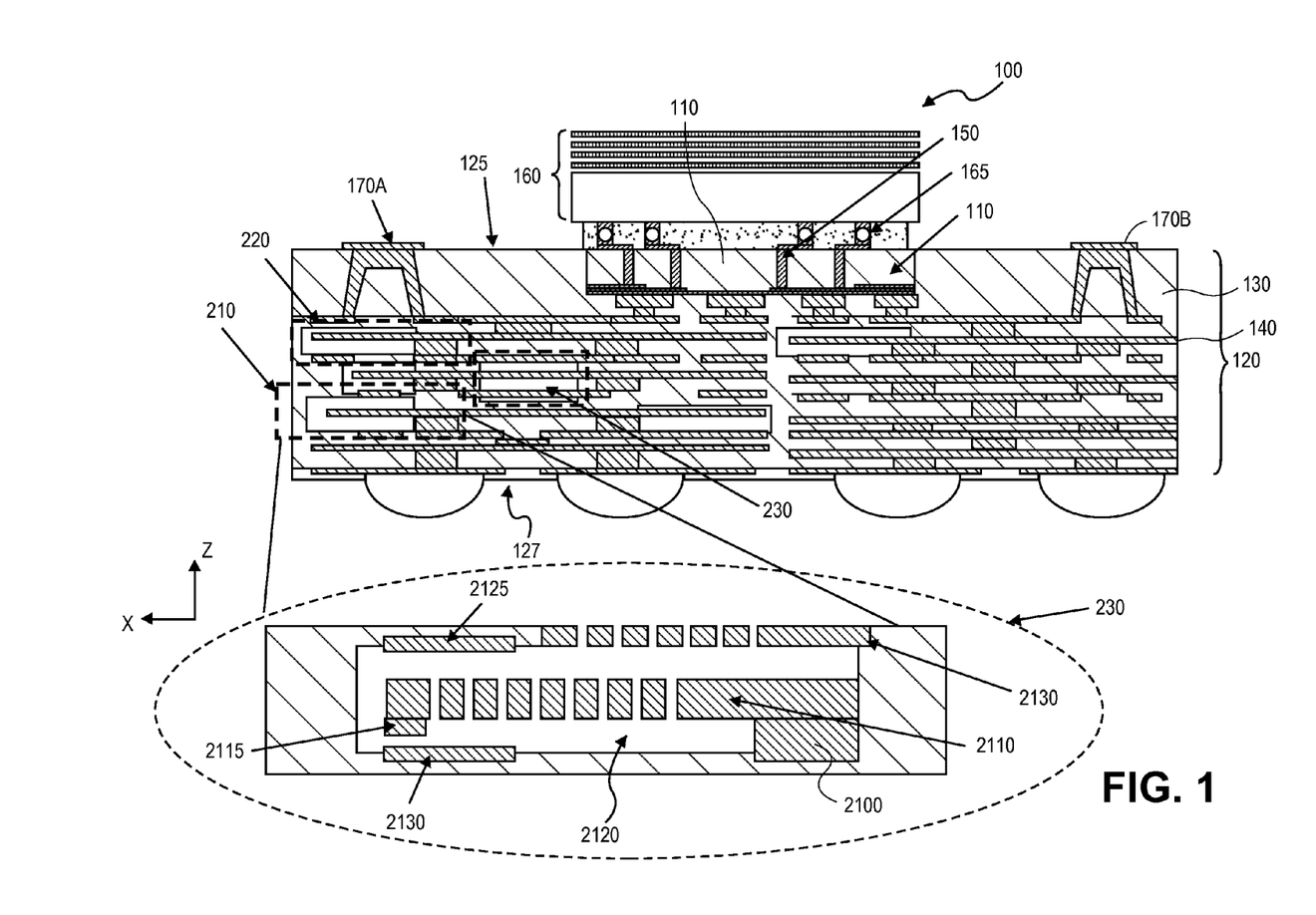
FIG. 1 shows a cross-sectional view one embodiment of a microelectronic package including a through silicon via die and a build-up carrier connected to the die and having a number of devices disposed therein.

FIG. 1 shows a cross-sectional side view of a microelectronic package according to one embodiment. As illustrated in FIG. 1, microelectronic package 100 utilizes bumpless build-up layer (BBUL) technology. Microelectronic package 100 includes carrier 120 having surface 125 and opposing surface 127. Die 110, such as a microprocessor die, is embedded in carrier 120 at surface 125. In one embodiment, die 110 is a silicon die or the like having a thickness of approximately 150 micrometers (μm). In another example, die 110 can be a silicon die or the like that has a thickness less than 150 μm such as 50 μm to 150 μm. It is appreciated that other thicknesses for die 110 are possible.

Referring to FIG. 1, die 110 and carrier 120 are in direct physical contact with each other (e.g., there are no solder bumps connecting die 110 to carrier 120). Die 110 is directly connected to carrier 120 at its device side (device side down as viewed). Carrier 120 includes multiple build-up layers including dielectric layers 130 and conductive layers 140 (connected with conductive vias or the like) that provide connectivity to the die (power, ground, input/output, etc.).

In the embodiment shown in FIG. 1, die 110 is a through silicon via (TSV) die. FIG. 1 shows die 110 having conductive vias 150 that extend from a device side of die to the contacts on a back side of the die. In this manner, a second device such as a logic device or memory device or several devices (stacked devices) may be connected to die 110 through the contacts on the back side of the die (e.g., wide I/O configuration). FIG. 1 shows memory or logic die or stack memory/logic die 160 connected to contacts on a back side of die 110 through logic-memory interface (LMI) or logic-logic interface (LLI) 165.

In addition to the ability to connect a secondary device to the back side of die 100, in the embodiment shown in FIG. 1, microelectronic package 100 includes contacts 170A and 170B on surface 125 of carrier 120. It is appreciated that contacts 170A and 170B are individual contacts representative of possibly many contacts that surround a periphery of carrier 120 to make contact with a secondary device. Contact 170A and contact 170B are connected to vias 120. Contact 170A and contact 170B are available for connection to a secondary device such as a memory device or microprocessor (possibly encompassed in a package). In the situation where the secondary device is a package that is connected to microelectronic package 100, a package on package (POP) configuration is described.

Referring to carrier 120, as noted above, the carrier is made of multiple layers or levels of patterned conductive material such as copper and is separated from adjacent layers by dielectric material. It is appreciated that the patterning of conductive layers separated by dielectric material offers space (area and volume) for additional devices. Such areas or volumes are referred to herein as voids. Thus, in one embodiment, a portion of the voids are utilized by the inclusion of one or more devices therein. Representative devices include microelectromechanical systems (MEMS) devices, such as sensors and actuators. Examples include, but are not limited to, resonators, switches, accelerometers, biosensors and optical devices (MOEMS). FIG. 1 shows a number of devices at different levels in carrier 120 including device 210, device 220 and device 230. The devices may extend between levels of patterned conductive material. Device 210 is, for example, a single clamped structure with a top and bottom actuator electrode. Device 220 is a singly clamped structure with a bottom electrode. Device 230 is a doubly clamped structure/membrane. As illustrated, each of device 210, device 220 and device 230 is sealed within dielectric layers of carrier 120. Although sealed, each structure is a free-standing structure formed in a cavity of various levels of carrier 120 (e.g., at different voids possibly at different depths of the carrier).

FIG. 1 shows a magnified view of device 210 that is, for example, a switch. Device 210 includes anchor 2100 connected to cantilever beam 2110. At an end opposite anchor 2100, beam 2110 includes contact tip 2115. Beam 2110 is disposed in cavity 2120 and can therefore move freely within cavity, particularly in a z-direction within the cavity. Above beam 2110 (as viewed) is top electrode 2125 and below beam 2110 (as viewed) is bottom electrode 2130. Top electrode 2125 and bottom electrode 2130 may be connected to a patterned conductive line of carrier 120 to transfer signals from device 210 of a switch (e.g., on/off signals) to carrier 120 and, for example, die 110.

As will be described in detail below, in one embodiment, a device like device 210 is initially formed encapsulated in dielectric material (i.e., there is no cavity surrounding the device). Referring to the expanded view of device 210, beam 2110 includes a number of through holes 2120. Through holes 2120 are used, in one embodiment, to provide access to dielectric material otherwise shielded by beam 2110. Access allows etching or laser removal techniques to remove dielectric material around the device and create cavity 2120. Similarly, sealing structure 2130 over cavity 2120, such as a patterned copper line, has through holes to allow removal of dielectric material above beam 2110 (as viewed).

The integration of one or more devices at the back end package level allows the integration of functional blocks (e.g., resonators, sensors) without consuming silicon real estate. The integration of devices in packages also increases the margin for scalability (because a package is larger than a die) without sacrificing the benefits of a die embedded in a package achievable with BBUL technology.

One possible application of package based MEMS devices is the integration of differential MEMS structures to eliminate potential noise coming from possible temperature changes and moisture uptake in laminates of the package. For example, MEMS devices with dimensions in a fixed ratio can be paired and electrical data collected based on the ratio of the two devices.

FIGS. 2-15 describe one embodiment for forming a microelectronic package, such as microelectronic package 100 (FIG. 1) including one or more devices, such as MEMS devices embedded therein. The method will describe the incorporation of a single device (a MEMS resonator or switch). The techniques described can be used, however, to incorporate a number of devices in a package, particularly MEMS devices that are traditionally formed through lithography processes in silicon.

Figure 2:
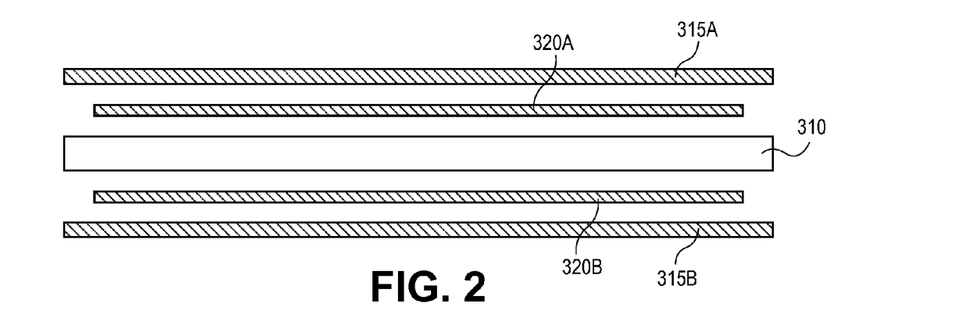
FIG. 2 shows a cross-sectional exploded side view of a sacrificial substrate with sacrificial copper foils attached to opposite sides thereof.

Referring to FIG. 2, FIG. 2 shows an exploded side view of a portion of a sacrificial substrate 310 of, for example, a prepeg material including opposing layers of copper foils 315A and 315B that are separated from sacrificial substrate 310 by shorter copper foil layers 320A and 320B, respectively.

Figure 3:
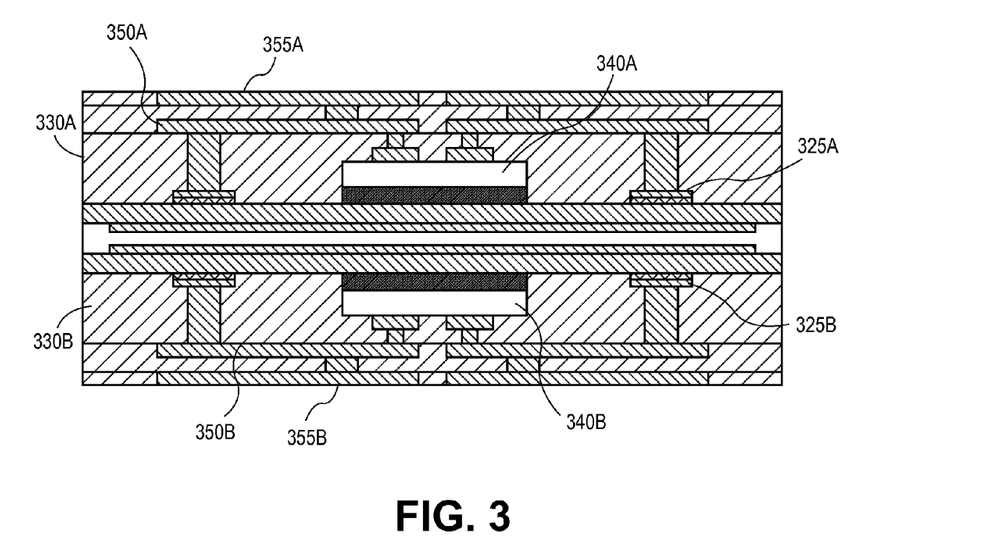
FIG. 3 show the structure of FIG. 2 following the attaching of a die and the formation of contacts on each of the copper foils, dielectric material formed over the die and conductive material in vias to the die and contacts and the formation of two conductive metal lines.

FIG. 3 shows the structure of FIG. 2 following the mounting of die 340A and die 340B on opposite sides of the structure. Die 340A and die 340B are mounted on copper foils 315A and 315B, respectively, through an adhesive such as die back side film (DBF) polymer/epoxy based adhesive with or without fillers. Each die is mounted with its device side away from the respective copper foil.

FIG. 3 shows the structure of FIG. 2 following the formation of package contacts 325A and 325B on opposite sides of the structure. Contacts 325A and 325B will serve as external package contacts for connecting a microelectronic package to another package (a POP configuration) or a device. In one embodiment, contacts 325A and 325B include a first layer adjacent copper foil 315A and copper foil 315B, respectively, of a gold-nickel alloy and a second layer overlying the gold-nickel alloy of copper or copper alloy. Contacts 325A and 325B may be formed by deposition (e.g., plating, sputter deposition, etc.) and patterning at a desired location for possible electrical contact with another package or device.

Following the mounting of 340A and die 340B and the formation of contacts 325A and 325B on copper foils 315A and 315B, respectively, a dielectric material is introduced on opposite sides of the structure to encapsulate the die and contacts. One suitable dielectric material is an ABF material introduced, for example, as a film (a laminate). FIG. 3 shows dielectric materials 330A and 330B on opposite sides of the structure, respectively, encapsulating the die and contacts.

FIG. 3 further shows conductors formed in vias through dielectric materials 330A and 330B, respectively, and contact 325A and contact 325B, respectively and to contacts on die 340A and die 340B, respectively. Overlying the conductive material vias in FIG. 2 are patterned conductive lines 350A and 350B (a first level of conductors). Representatively, the vias may be formed by a drilling process. Conductive material in the vias and patterned conductive lines may be formed using an electroless seed layer followed by a dry film resist (DFR) patterning and plating. The DFR may then be stripped followed by a flash etch to remove any electroless seed layer. FIG. 3 still further shows patterned conductive lines 355A and 355B (a second level of conductors), respectively, formed over conductive lines 350A and 350B, respectively. Conductive lines 350A and 350B are separated from respective patterned conductive lines 355A and 355B by dielectric material 335A and 335B, respectively, such as an ABF film.

Figure 4:
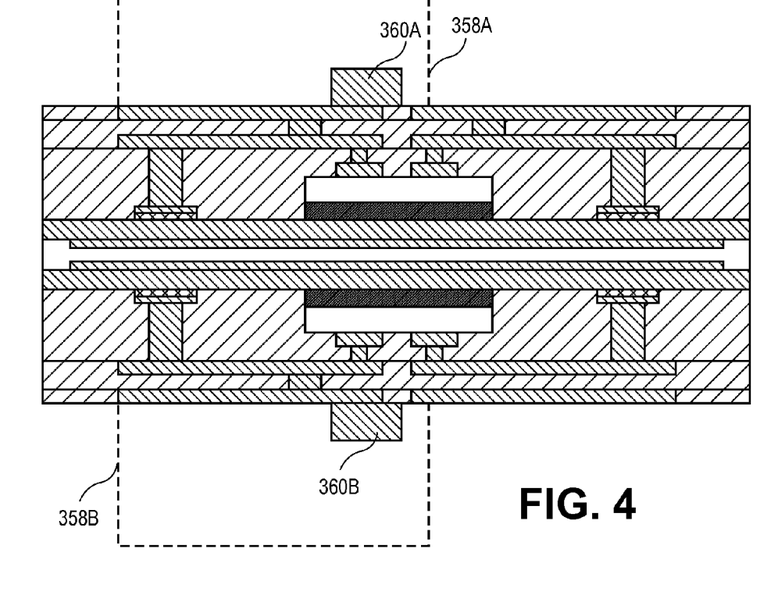
FIG. 4 shows the structure of FIG. 3 following the formation of an electrode for a device on the second conductive line.

According to one embodiment, a void is designated in a volume or three-dimensional space over an area of second conductor 355A and 355B, respectively. It is appreciated that in the formation of a package, including a build-up package as shown, conductive lines and vias are positioned in predetermined locations within or on the package. Because such locations are predetermined, knowing where the conductive lines and vias will be located allows voids to be identified. FIG. 4 shows void 358A and void 358B located in an area over second conductive lines 355A and 355B, respectively. It is within void 358A and 358B that a MEMS device will be formed.

FIG. 4 shows the structure of FIG. 3 following the patterning of bottom electrode 360A and bottom electrode 360B over second conductive lines 355A and 355B, respectively. In one embodiment, an electrode is formed of a conductive material such as copper, by way of an electroless plating process including DFR patterning/electroplating followed by flash etching to form the electrode. Electrode 360A and electrode 360B are used, for example, for electrostatic actuation or capacitive sensing protection of a device being formed.

In the description of the process of forming a package with respect to FIGS. 2-4, a duplicative process on opposite sides of sacrificial substrate 310 has been described. Going forward, for clarity only a description of the process on a single side will be illustrated and described. It is appreciated that the described process may be repeated on the opposite side of the sacrificial substrate.

Figure 5:
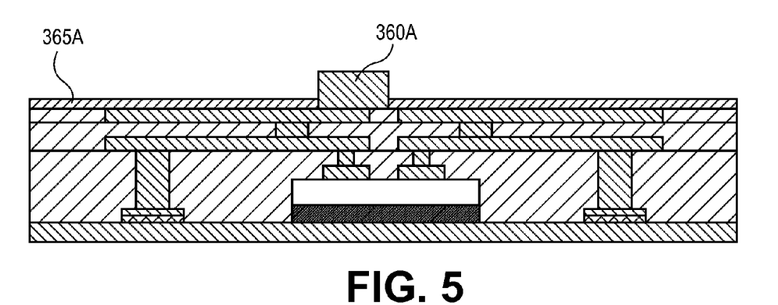
FIG. 5 shows the structure of FIG. 4 following the introduction of an etch stop layer on the second conductive line.

FIG. 5 shows the structure of FIG. 4 following the introduction of a release etch stop layer. Specifically, release etch stop layer 365A is a material that has different etch characteristics than dielectric material otherwise used in the formation of the carrier. Representatively, where the carrier will otherwise use an ABF material as a dielectric material, release etch stop layer 365A is a low-E ABF or an ABF derivative that has, for example, a lower plasma etch rate compared to the previously used ABF material.

Figure 6:
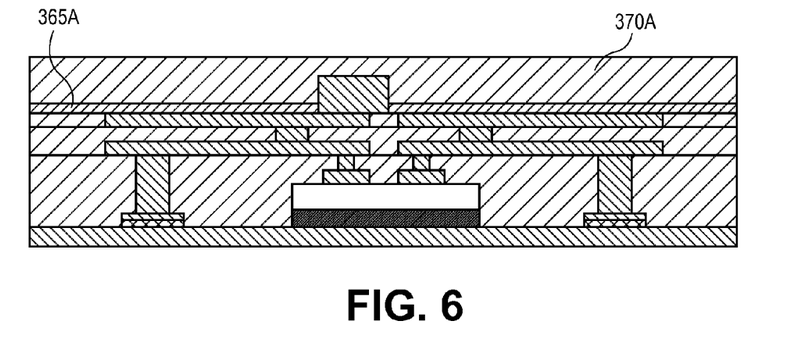
FIG. 6 shows the structure of FIG. 5 following the introduction of a dielectric layer on the etch stop layer and on the electrode.

FIG. 6 shows the structure of FIG. 5 following the introduction of dielectric material over etch stop layer 365A and bottom electrode 360A. Dielectric layer 370A is, for example, an ABF material that is different than etch stop layer 365A (e.g., a different etch rate). Dielectric layer 370A is selected, in one embodiment, to be of a desired thickness for a gap height of a device to be formed. A representative thickness is on the order of 5 µm to 50 µm.

Figure 7:
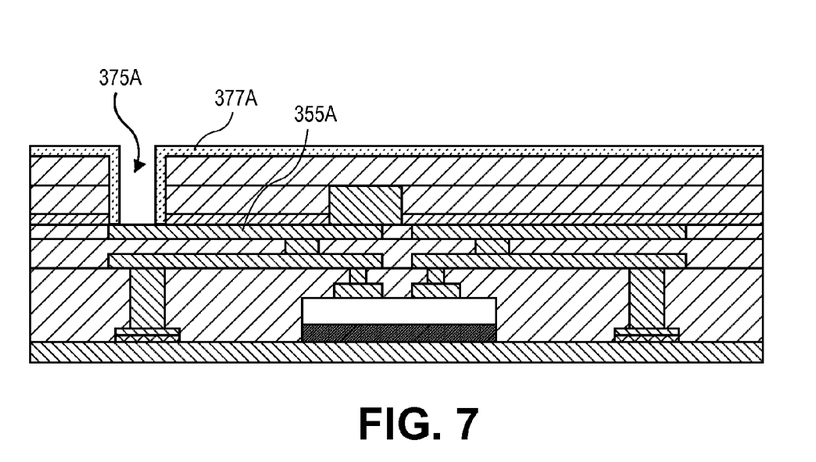
FIG. 7 shows the structure of FIG. 6 following the forming of an opening in the dielectric layer to the second conductive line and a seed layer form in the opening and on the dielectric layer.

FIG. 7 shows the structure of FIG. 6 following the forming of an opening in dielectric layer 370A to second conductive line 355A. Opening 375A has dimensions selected for an anchor of the device to be formed. Representatively, opening 375A may be formed using a carbon dioxide ($CO_2$) laser. Overlying opening 375A is a seed material for, for example, a copper electroless process. Seed material 377A lines opening 375A and is formed on dielectric layer 370A.

Figure 8:
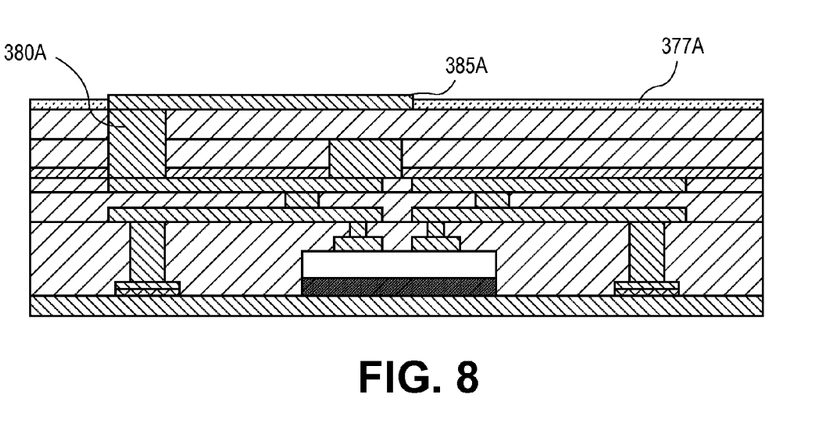
FIG. 8 shows the structure of FIG. 7 following the introduction of a conductive material in the opening in the dielectric layer and the patterning of a beam on the dielectric layer.

FIG. 8 shows the structure of FIG. 7 following the deposition of a conductive material in opening 375A and on the surface of dielectric layer 370A. The deposition of material in opening 375A defines anchor 380A. The material deposited on a surface of the dielectric layer 370A defines beam 385A of the device. Anchor 380A and beam 385A may be formed by DFR patterning/electroplating and flash etching.

Figure 9:
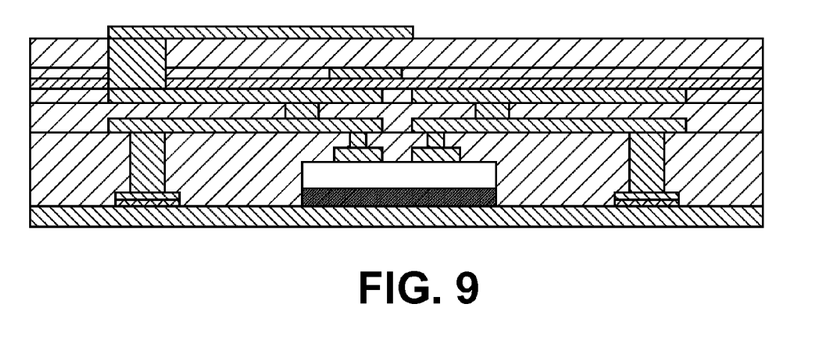
FIG. 9 shows the structure of FIG. 8 following the removal of the seed layer.

FIG. 9 shows the structure of FIG. 8 following the removal of seed material 377A. Representatively, seed material 377A of the die may be removed by an etch.

Figure 10:
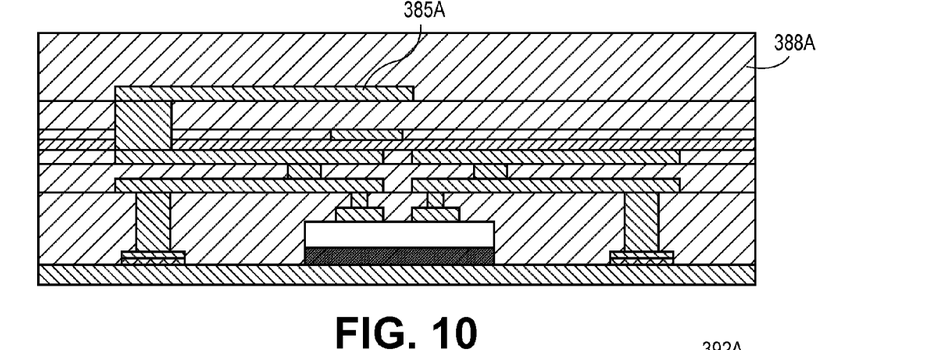
FIG. 10 shows the structure of FIG. 9 following the deposition of a dielectric layer on the structure.

FIG. 10 shows the structure of FIG. 9 following the deposition of a dielectric layer on the structure. One material for dielectric layer 388A is an ABF dielectric material introduced as a film. As shown in FIG. 10, dielectric layer 388A encapsulates beam 385A.

Figure 11:
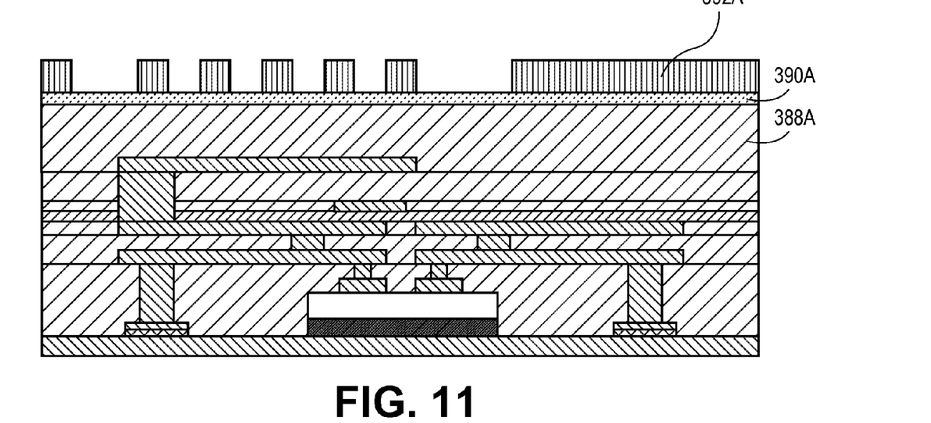
FIG. 11 shows the structure of FIG. 10 following the introduction of a seed layer on the dielectric layer and a pattern on the seed layer.

FIG. 11 shows the structure of FIG. 10 following the introduction of a seed layer on dielectric layer 388A. Representatively, seed layer 390A is a material suitable to promote electroless copper deposition. Overlying seed layer 390A is pattern 392A of a sacrificial material such as a DFR material. Pattern 392A includes designated openings therethrough to seed layer 390A.

Figure 12:
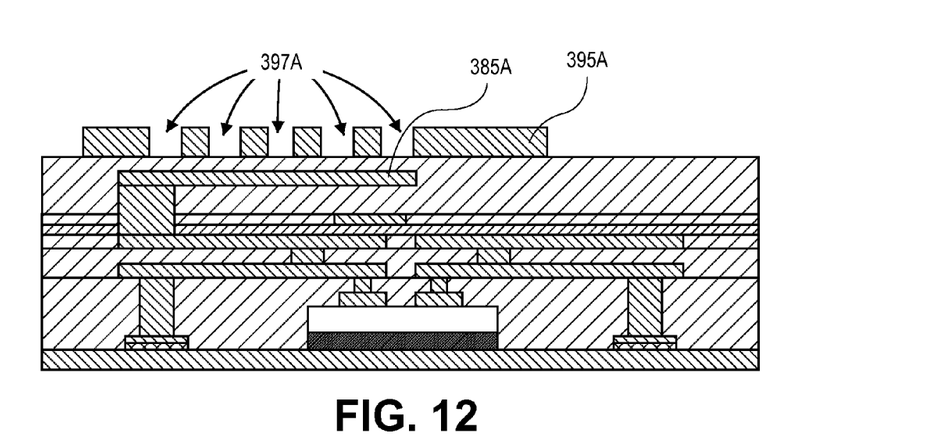
FIG. 12 shows the structure of FIG. 11 following the introduction of a conductive material as a seal layer on the structure and the removal of the pattern and the seed layer.

FIG. 12 shows the structure of FIG. 11 following the introduction of a conductive material such as copper on the structure by, for example, an electroless deposition process on seed layer 390A. FIG. 12 also shows the structure after the removal of pattern 392A and excess seed layer 390A. What remains is patterned seal layer 395A. Referring to FIG. 12, seal layer 395A, for example, copper, was patterned over beam 385A. Seal layer 395A includes a number of openings 397A to the underlying dielectric material (dielectric layer 388A) over beam 385A.

Figure 13:
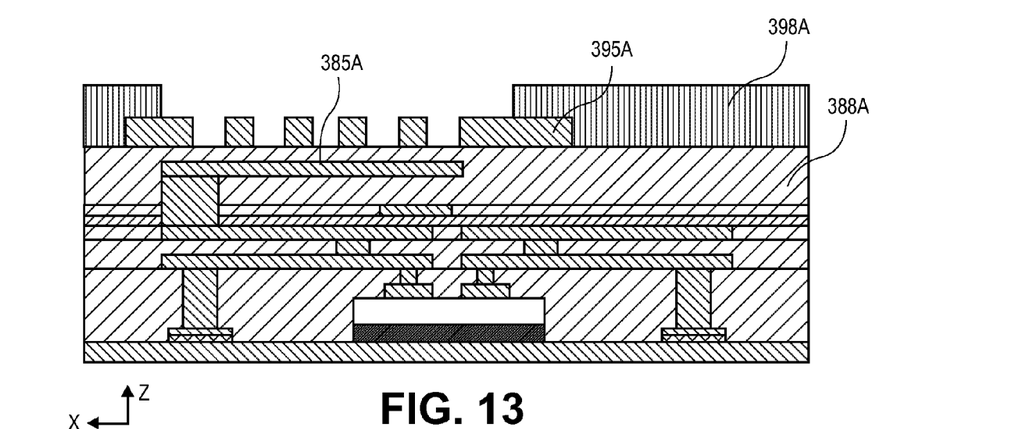
FIG. 13 shows the structure of FIG. 12 following the introduction and patterning of a pattern to expose the seal layer and otherwise protect the structure.

FIG. 13 shows the structure of FIG. 12 following the introduction and patterning of pattern 398A over the structure. Pattern 398A is, for example, a DFR material patterned to have an opening over the seal layer 395A specifically over openings 397A in seal layer 395A. FIG. 13 also shows the removal of dielectric material around beam 385A. One way the dielectric material is removed is by plasma etching the dielectric material using openings 397A in seal layer 395A as access points to the dielectric through the seal layer.

Figure 14:
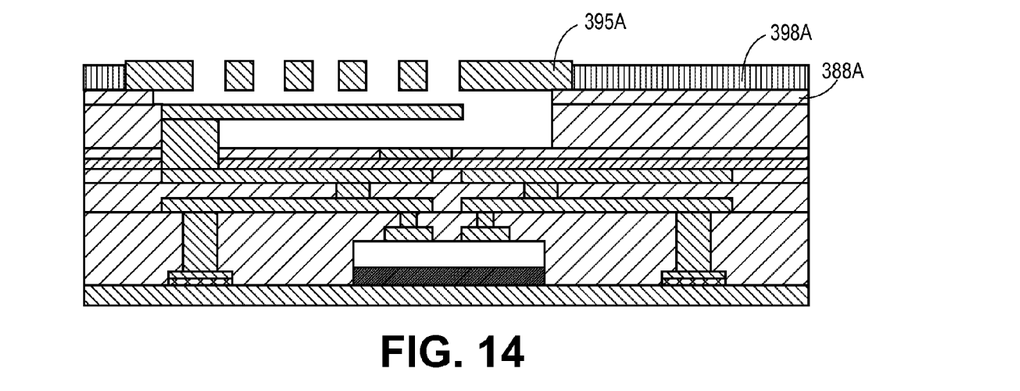
FIG. 14 shows the structure of FIG. 13 and illustrates the release of the beam by removal of dielectric material around the beam.

FIG. 14 shows the structure of FIG. 13 and shows the release of the device by the removal of adjacent dielectric material. The dielectric material is removed above and below beam 385A such that beam 385A is free to move in at least a z-direction. In another embodiment, similar release holes can be patterned in beam 385A if the dimensions of beam 385A are too large for successful isotropic plasma undercutting of dielectric material.

Figure 15:
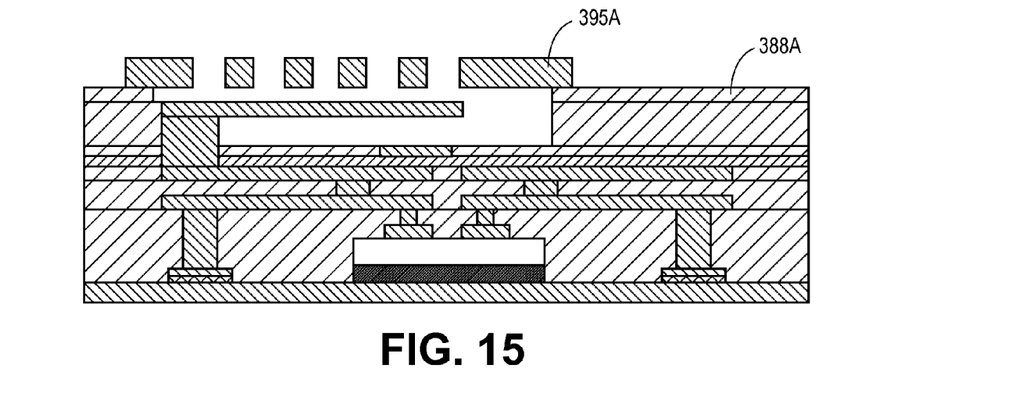
FIG. 15 shows the structure of FIG. 14 following the removal of the pattern.
Figure 16:
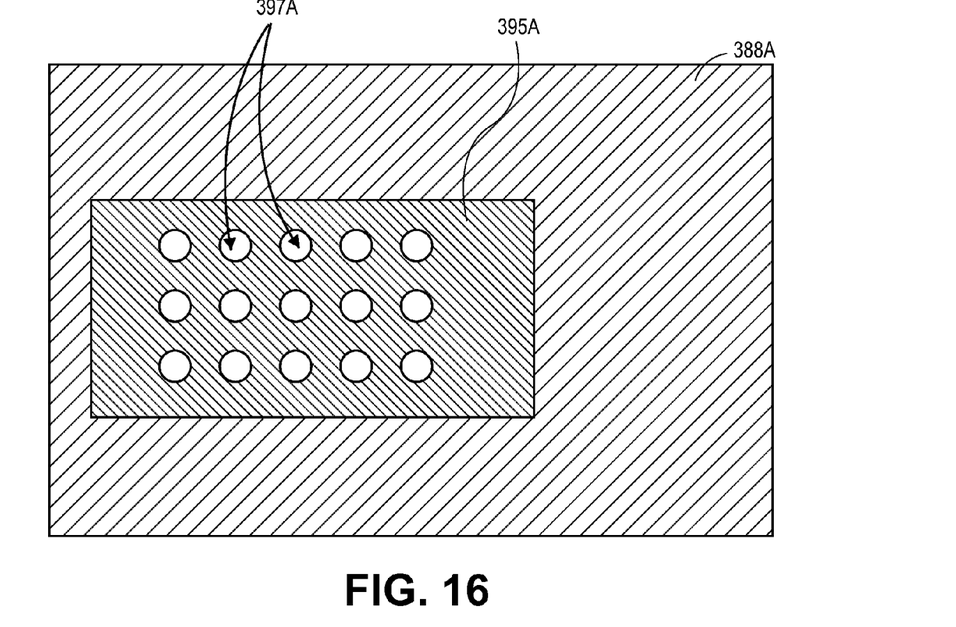
FIG. 16 shows a top view of the structure of FIG. 15.

FIG. 15 shows the structure of FIG. 14 following the removal of pattern 398A. FIG. 16 shows a top view of the structure of FIG. 15. Sealing seal layer 395A and the underlying device with a laminate film (e.g., ABF dielectric) will not result in the dielectric infiltrating the void.

Figure 17:
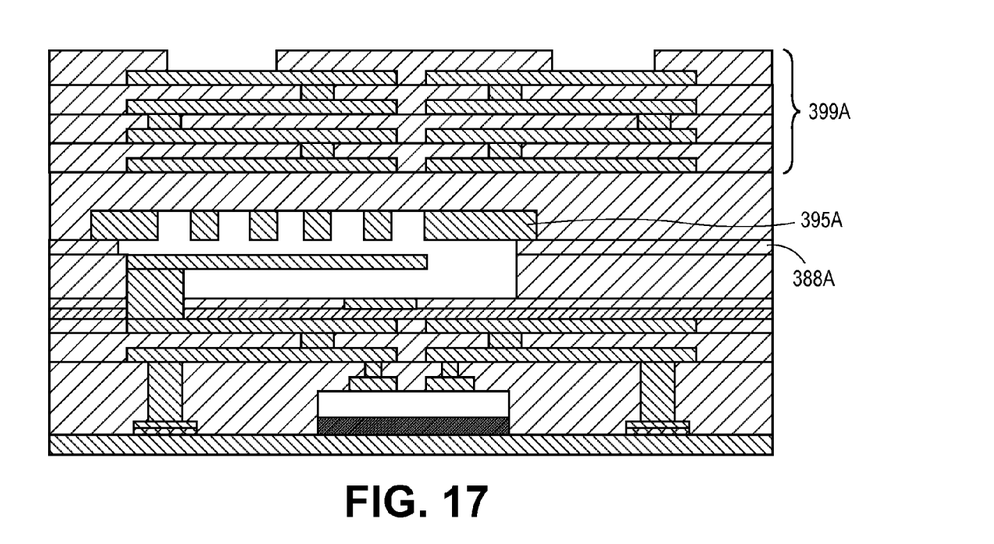
FIG. 17 shows the structure of FIG. 15 following the introduction of additional conductive lines on the structure.

Following the formation of the device (MEMS device) in FIG. 14, formation of a build-up carrier may continue by the introduction of additional levels of conductive material. A typical BBUL package may have four to six levels of conductive material (conductive traces or lines). FIG. 17 shows the structure of FIG. 16 after the introduction of four additional conductive lines 399A on the structure. An ultimate conductive level is patterned with contacts that are suitable, for example, for a surface mount packaging complementation.

Once the ultimate conductive level of the build-up carrier is patterned, the structure may be removed from sacrificial substrate 310. At that point, a free standing microelectronic device including at least one device (a MEMS device) is formed in at least one void of the build-up carrier. If die 340A is a TSV die, additional processes may be performed to access a back side of the die (e.g., a process to remove the adhesive covering the back side).

Figure 18:
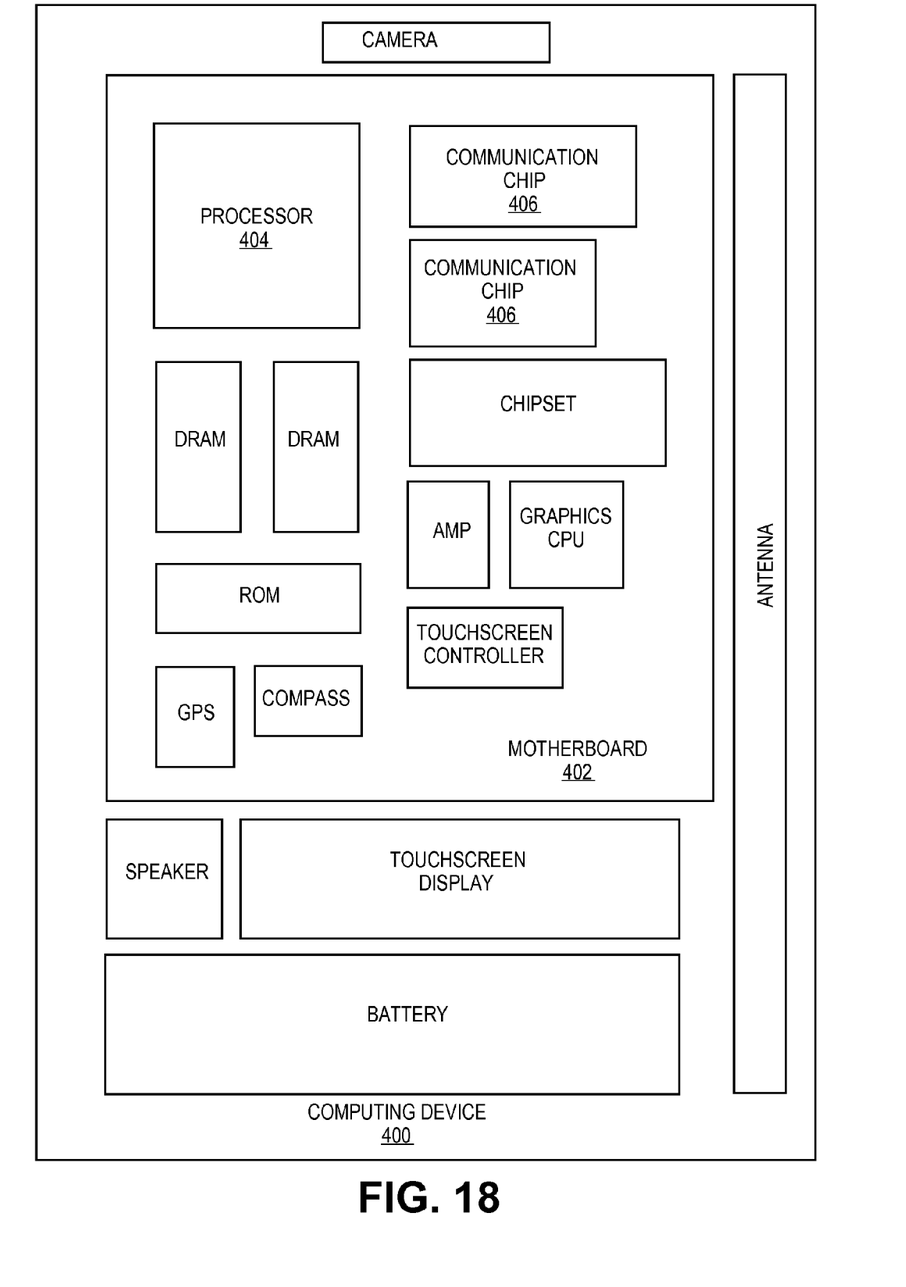
FIG. 18 illustrates a schematic illustration of a computing device.

FIG. 18 illustrates a computing device 400 in accordance with one implementation. The computing device 400 houses board 402. Board 402 may include a number of components, including but not limited to processor 404 and at least one communication chip 406. Processor 404 is physically and electrically connected to board 402. In some implementations the at least one communication chip 406 is also physically and electrically coupled to board 402. In further implementations, communication chip 406 is part of processor 404.

Depending on its applications, computing device 400 may include other components that may or may not be physically and electrically connected to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. In some implementations, the package formed in accordance with embodiment described above utilizes BBUL technology with one or more devices (e.g., MEMS devices) positioned in a void in build-up carrier of the package. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In accordance with another implementation, package is based on BBUL technology and may incorporate a device in a void of the build-up carrier.

In further implementations, another component housed within computing device 400 may contain a microelectronic package that may incorporate a device (e.g., MEMS device) in a void in a build-up carrier of the package.

In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The invention claimed is:

1. An apparatus comprising:
 a computing device comprising a package including a microprocessor disposed in a build-up carrier,
 the microprocessor comprising a first side and an opposite second side comprising a device side with contact points;
 a build-up carrier coupled to the second side of the microprocessor, the build-up carrier comprising:
  a plurality of alternating layers of patterned conductive material and insulating material starting from at least one layer of insulating material encapsulating the die and defining a first carrier side and accessible contacts on the first carrier side, wherein at least one of the layers of patterned conductive material is coupled to one of the contact points of the die,
 at least one device within the build-up carrier disposed in an area void of a layer of patterned conductive material and comprising on one side a seal structure comprising a conductive material comprising a plurality of openings therethrough, and a plurality of accessible second carrier contacts coupled to the conductive material on a second carrier side; and a printed circuit board coupled to at least a portion of the plurality of accessible contacts.

2. The apparatus of claim 1, wherein the at least one device comprises a microelectromechanical system (MEMS) device.

3. The apparatus of claim 1, wherein the at least one device comprises a free-standing device.

4. An apparatus comprising:

a die comprising a first side and an opposite second side comprising a device side with contact points and lateral sidewalls defining a thickness of the die;

a build-up carrier coupled to the second side of the die, the build-up carrier comprising a plurality of alternating layers of patterned conductive material and insulating material starting from at least one layer of insulating material encapsulating the die and defining a first carrier side and contacts on the first carrier side and on an opposite second carrier side, wherein at least one of the layers of patterned conductive material is coupled to one of the contact points of the die; and at least one device within the build-up carrier disposed in an area void of a layer of patterned conductive material and comprising on one side a seal structure comprising a conductive material comprising a plurality of openings therethrough.

5. The apparatus of claim 4, wherein the at least one device comprises a free-standing device.

6. The apparatus of claim 4, wherein the at least one device is disposed in the build-up carrier between adjacent layers of conductive material.

7. The apparatus of claim 4, wherein the at least one device comprises a microelectromechanical system (MEMS) device.

8. The apparatus of claim 7, wherein the at least one MEMS devices is a sensor.

9. The apparatus of claim 7, wherein the at least one MEMS device is an actuator.

10. An apparatus comprising:

a die;

a build-up comprising a plurality of layers of patterned conductive material separated from adjacent layers by insulating material starting from at least one layer of insulating material encapsulating the die, wherein at least one of the layers of patterned conductive material is coupled to a contact point of the die; and at least one device within the build-up carrier disposed in an area void of a layer of patterned conductive material and comprising on one side a seal structure comprising a conductive material comprising a plurality of openings therethrough.

11. The apparatus of claim 10, wherein the at least one device comprises a free-standing device.

12. The apparatus of claim 10, wherein the at least one device comprises a microelectromechanical system (MEMS) device.

13. The apparatus of claim 12, wherein the at least one MEMS devices is a sensor.

14. The apparatus of claim 12, wherein the at least one MEMS device is an actuator.

15. The apparatus of claim 12, wherein the at least one MEMS device is disposed in the build-up carrier between adjacent layers of conductive material.

* * * * *